(12) United States Patent
Tao et al.

(10) Patent No.: US 10,090,136 B2
(45) Date of Patent: Oct. 2, 2018

(54) OXIDE SINTERED BODY AND SPUTTERING TARGET, AND METHOD FOR PRODUCING SAME

(71) Applicant: KOBELCO RESEARCH INSTITUTE, INC., Kobe-shi (JP)

(72) Inventors: Yuki Tao, Hyogo (JP); Hideo Hata, Hyogo (JP); Akira Nambu, Hyogo (JP); Moriyoshi Kanamaru, Hyogo (JP)

(73) Assignee: KOBELCO RESEARCH INSTITUTE, INC., Kobe-shi (JP)

( * ) Notice: Subject to any disclaimer, the term of this patent is extended or adjusted under 35 U.S.C. 154(b) by 645 days.

(21) Appl. No.: 14/427,719

(22) PCT Filed: Sep. 10, 2013

(86) PCT No.: PCT/JP2013/074338
§ 371 (c)(1),
(2) Date: Mar. 12, 2015

(87) PCT Pub. No.: WO2014/042138
PCT Pub. Date: Mar. 20, 2014

(65) Prior Publication Data
US 2015/0248996 A1    Sep. 3, 2015

(30) Foreign Application Priority Data

Sep. 14, 2012   (JP) ................................ 2012-203576

(51) Int. Cl.
*H01J 37/34*   (2006.01)
*C23C 14/08*   (2006.01)
(Continued)

(52) U.S. Cl.
CPC .......... *H01J 37/3429* (2013.01); *C04B 35/01* (2013.01); *C04B 35/453* (2013.01);
(Continued)

(58) Field of Classification Search
CPC ..... C04B 35/01; C04B 35/453; C04B 35/457; C04B 35/64; C04B 2235/3286;
(Continued)

(56) References Cited

U.S. PATENT DOCUMENTS

| 2005/0084799 A1 | 4/2005 | Yahagi et al. |
| 2011/0177696 A1 | 7/2011 | Yang et al. |
| 2013/0240802 A1 | 9/2013 | Miki et al. |

FOREIGN PATENT DOCUMENTS

| JP | 05-311428 | 11/1993 |
| JP | 07-243036 | 9/1995 |

(Continued)

OTHER PUBLICATIONS

International Search Report and Written Opinion dated Nov. 26, 2013 in PCT/JP2013/074338 filed on Sep. 10, 2013 (with English translation).

*Primary Examiner* — Rodney G McDonald
(74) *Attorney, Agent, or Firm* — Oblon, McClelland, Maier & Neustadt, L.L.P.

(57) ABSTRACT

An oxide sintered body which is obtained by mixing and sintering zinc oxide, indium oxide, gallium oxide and tin oxide. The relative density of the oxide sintered body is 85% or more and the average grain size of crystal grains observed on the surface of the oxide sintered body is less than 10 μm. X-ray diffraction of the oxide sintered body shows that a $Zn_2SnO_4$ phase and an $InGaZnO_4$ phase are the main phases and that an $InGaZn_2O_5$ phase is contained in an amount of 3 volume % or less.

14 Claims, 2 Drawing Sheets

(51) Int. Cl.
*C23C 14/34* (2006.01)
*C04B 35/457* (2006.01)
*C04B 35/01* (2006.01)
*C04B 35/453* (2006.01)
*C04B 35/64* (2006.01)
*H01L 21/02* (2006.01)

(52) U.S. Cl.
CPC ............ *C04B 35/457* (2013.01); *C04B 35/64* (2013.01); *C23C 14/08* (2013.01); *C23C 14/086* (2013.01); *C23C 14/3414* (2013.01); *H01J 37/3491* (2013.01); *C04B 2235/3286* (2013.01); *C04B 2235/3293* (2013.01); *C04B 2235/658* (2013.01); *C04B 2235/6562* (2013.01); *C04B 2235/66* (2013.01); *C04B 2235/763* (2013.01); *C04B 2235/77* (2013.01); *C04B 2235/786* (2013.01); *C04B 2235/80* (2013.01); *H01L 21/02554* (2013.01); *H01L 21/02565* (2013.01); *H01L 21/02631* (2013.01)

(58) Field of Classification Search
CPC .... C04B 2235/3293; C04B 2235/6562; C04B 2235/658; C04B 2235/66; C04B 2235/763; C04B 2235/77; C04B 2235/786; C04B 2235/80; C23C 14/08; C23C 14/086; C23C 14/3414; H01J 37/3429; H01J 37/3491; H01L 21/02554; H01L 21/02565; H01L 21/02631
USPC ....................................... 204/298.12, 298.13
See application file for complete search history.

(56) References Cited

FOREIGN PATENT DOCUMENTS

| | | |
|---|---|---|
| JP | 2003-242684 | 8/2003 |
| JP | 3746094 B2 | 2/2006 |
| JP | 2012-114367 | 6/2012 |
| JP | 2012-158512 | 8/2012 |
| WO | WO 2009-142289 A | 11/2009 |
| WO | WO 2012/070676 A1 | 5/2012 |

OXIDE SINTERED BODY AND SPUTTERING TARGET, AND METHOD FOR PRODUCING SAME

TECHNICAL FIELD

The present invention relates to an oxide sintered body and sputtering target for use in deposition, by a sputtering method, of oxide semiconductor thin films of thin-film transistors (TFTs) to be used in display devices such as liquid crystal displays and organic EL displays, and a method for producing the same.

BACKGROUND ART

Amorphous (noncrystalline) oxide semiconductors for use in TFTs have higher carrier mobility and larger optical band gaps and can be deposited at lower temperatures as compared with the cases of general amorphous silicon (a-Si). Therefore, the amorphous oxide semiconductors are expected to be applied to next-generation displays which are required to have large sizes and high resolutions and to achieve high-speed drive; and to resin substrates which have low thermal stability. As compositions of oxide semiconductors suitable for these applications, for example, In-containing amorphous oxide semiconductors [In—Ga—Zn—O (IGZO) etc.] have been proposed.

For deposition of the above oxide semiconductor (film), a sputtering method has been preferably employed, in which a sputtering target (hereinafter sometimes referred to as "target material") composed of the same materials as the film is subjected to sputtering. In the sputtering method, for stabilization of properties of thin films as products and for efficient production, for example, it is important to prevent abnormal discharge or the like during sputtering, and various techniques have been proposed.

For example, Patent Document 1 proposes a technique of suppressing abnormal discharge by refining average grain size of grains, for an ITO target.

Moreover, Patent Document 2 proposes a technique of preventing a target material from cracking during sputtering by increasing sintered density and also refining grain size, for an ITO target.

Furthermore, Patent Document 3 proposes a technique of increasing conductivity of a target material, thereby suppressing abnormal discharge during sputtering, by subjecting an In—Zn—O-based composite oxide to an annealing treatment in a reducing atmosphere after sintering.

CITATION LIST

Patent Documents

Patent Document 1: JP-A-7-243036
Patent Document 2: JP-A-5-311428
Patent Document 3: Japanese Patent No. 3746094

SUMMARY OF THE INVENTION

Technical Problems

With recent progress in performance of display devices, an improvement in properties of oxide semiconductor thin films and stabilization of the properties have been requested and also it is required to produce the display devices more efficiently. Therefore, a target material for use in the production of the oxide semiconductor films for display devices and an oxide sintered body as a raw material thereof have been desired to have a composition which corresponds to high carrier mobility to be required. In consideration of productivity, production costs and the like, it is also important to further suppress abnormal discharge (arching) and cracking of the target material during the sputtering step. Accordingly, it is required to improve the target material and the oxide sintered body as a raw material thereof.

The present invention has been made under these circumstances, and an object thereof is to provide an oxide sintered body and sputtering target which are preferably used for the production of oxide semiconductor films for display devices, which enable the suppression of abnormal discharge and cracking of the target material and also the stable deposition of the oxide semiconductor films by a sputtering method, and a method for producing the same.

Solution to Problems

The present invention provides the following oxide sintered body, sputtering target and method for producing the oxide sintered body.

<1> An oxide sintered body obtained by mixing and sintering a zinc oxide; an indium oxide; a gallium oxide; and a tin oxide,
wherein the oxide sintered body has a relative density of 85% or more,
the oxide sintered body has an average grain size of less than 10 μm, and
the oxide sintered body has volume ratios of a $Zn_2SnO_4$ phase and an $InGaZnO_4$ phase, which satisfy the following expressions (1) to (3), respectively, and has a volume ratio of an $InGaZn_2O_5$ phase which satisfies the following expression (4), as determined by X-ray diffractometry:

$$(Zn_2SnO_4 \text{ phase} + InGaZnO_4 \text{ phase})/(Zn_2SnO_4 \text{ phase} + InGaZnO_4 \text{ phase} + InGaZn_2O_5 \text{ phase} + SnO_2 \text{ phase}) \geq 70\% \text{ by volume} \quad (1)$$

$$Zn_2SnO_4 \text{ phase}/(Zn_2SnO_4 \text{ phase} + InGaZnO_4 \text{ phase} + InGaZn_2O_5 \text{ phase} + SnO_2 \text{ phase}) \geq 30\% \text{ by volume} \quad (2)$$

$$InGaZnO_4 \text{ phase}/(Zn_2SnO_4 \text{ phase} + InGaZnO_4 \text{ phase} + InGaZn_2O_5 \text{ phase} + SnO_2 \text{ phase}) \geq 10\% \text{ by volume} \quad (3)$$

$$InGaZn_2O_5 \text{ phase}/(Zn_2SnO_4 \text{ phase} + InGaZnO_4 \text{ phase} + InGaZn_2O_5 \text{ phase} + SnO_2 \text{ phase}) \geq 3\% \text{ by volume} \quad (4).$$

<2> The oxide sintered body according to <1>, which satisfies the following expressions (5) to (7) when content ratios (atomic %) of zinc, indium, gallium, and tin to all metal elements contained in the oxide sintered body are taken as [Zn], [In], [Ga], and [Sn], respectively:

$$40 \text{ atomic } \% \leq [Zn] \leq 50 \text{ atomic } \% \quad (5)$$

$$30 \text{ atomic } \% \leq ([In]+[Ga]) \leq 45 \text{ atomic } \% \quad (6)$$

wherein [In] is 4 atomic % or more, and [Ga] is 5 atomic % or more, $$15 \text{ atomic } \% \leq [Sn] \leq 25 \text{ atomic } \% \quad (7).$$

<3> The oxide sintered body according to <1> or <2>, wherein the average grain size is 0.1 μm or more.

<4> The oxide sintered body according to any one of <1> to <3>, wherein the relative density is 110% or less.

<5> The oxide sintered body according to any one of <1> to <4>, wherein the volume ratio of the $Zn_2SnO_4$ phase and the $InGaZnO_4$ phase satisfies the following expression (1'):

$$(Zn_2SnO_4 \text{ phase}+InGaZnO_4 \text{ phase})/(Zn_2SnO_4 \text{ phase}+ \\ InGaZnO_4 \text{ phase}+InGaZn_2O_5 \text{ phase}+SnO_2 \\ \text{phase}) \leq 100\% \text{ by volume} \quad (1').$$

<6> The oxide sintered body according to any one of <1> to <5>, wherein the volume ratio of the $Zn_2SnO_4$ phase satisfies the following expression (2'):

$$Zn_2SnO_4 \text{ phase}/(Zn_2SnO_4 \text{ phase}+InGaZnO_4 \text{ phase}+ \\ InGaZn_2O_5 \text{ phase}+SnO_2 \text{ phase}) \leq 90\% \text{ by volume} \quad (2').$$

<7> The oxide sintered body according to any one of <1> to <6>, wherein the volume ratio of the $InGaZnO_4$ phase satisfies the following expression (3'):

$$InGaZnO_4 \text{ phase}/(Zn_2SnO_4 \text{ phase}+InGaZnO_4 \text{ phase}+ \\ InGaZn_2O_5 \text{ phase}+SnO_2 \text{ phase}) \leq 60\% \text{ by volume} \quad (3').$$

<8> The oxide sintered body according to any one of <1> to <7>, wherein the volume ratio of the $InGaZn_2O_5$ phase satisfies the following expression (4'):

$$InGaZn_2O_5 \text{ phase}/(Zn_2SnO_4 \text{ phase}+InGaZnO_4 \text{ phase}+ \\ InGaZn_2O_5 \text{ phase}+SnO_2 \text{ phase}) \geq 0\% \text{ by volume} \quad (4').$$

<9> A sputtering target obtained from the oxide sintered body according to any one of <1> to <8>, which has a resistivity of 1 Ω·cm or less.

<10> The sputtering target according to <9>, wherein the resistivity is $10^{-7}$ Ω·cm or more.

<11> A method for producing the oxide sintered body according to any one of <1> to <8>, comprising, in this order: mixing a zinc oxide, an indium oxide, a gallium oxide, and a tin oxide; setting a mixture obtained by the mixing in a graphite die and elevating a temperature to a sintering temperature of 950 to 1150° C. at an average temperature-elevating rate of 600° C./hr or less; and sintering for a retention time of 0.1 to 5 hours in a region of the sintering temperature.

<12> The method for producing the oxide sintered body according to <11>, wherein the average temperature-elevating rate is 10° C./hr or more.

Advantageous Effects of the Invention

According to the present invention, it is possible to provide: an oxide sintered body and sputtering target, which enable the suppression of abnormal discharge and the suppression of cracking of the target material during the deposition of oxide semiconductor films, and the stable deposition by a sputtering method; and a method of producing the same.

DESCRIPTION OF EMBODIMENTS

Figure 1:
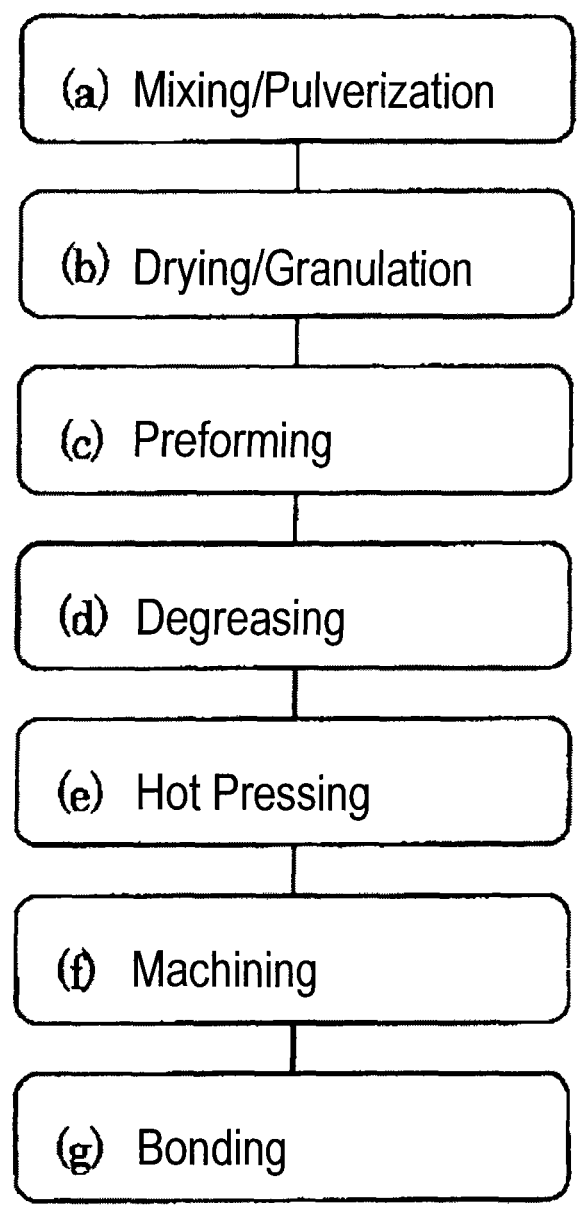
FIG. 1 illustrates basic steps for the production of an oxide sintered body and sputtering target according to the present invention.

The present inventors have made intensive investigations to provide an oxide sintered body for a sputtering target, which enables stable deposition of films for a long period of time through the suppression of abnormal discharge and cracking of the target material during sputtering and which is suitable for the deposition of an oxide semiconductor film having high carrier mobility.

As a result, they have found that the intended object is achieved by allowing an oxide sintered body obtained by mixing and sintering a zinc oxide; an indium oxide; a gallium oxide; and a tin oxide, to contain a $Zn_2SnO_4$ phase and an $InGaZnSnO_4$ phase as a main phase in predetermined ratios and have a reduced ratio of an $InGaZn_2SnO_5$ phase, as determined by X-ray diffractometry, to have high relative density, and to have a suppressed average grain size.

Moreover, for achieving the above object, they have found that it is also effective to appropriately control the content of each metal element contained in the oxide sintered body.

Specifically, they have found that (a) the oxide sintered body containing a zinc oxide, an indium oxide, a gallium oxide and a tin oxide, in which, for the phase constitution as determined by X-ray diffractometry, the ratios of the $Zn_2SnO_4$ phase and $InGaZnO_4$ phase are controlled, has an effect of suppressing abnormal discharge during sputtering, (b) the oxide sintered body in which the ratio of the $InGaZn_2O_5$ phase is reduced has an effect of suppressing abnormal discharge and suppressing cracking of the sputtering material, (c) the effect of suppressing the occurrence of abnormal discharge during sputtering can be further enhanced by increasing the relative density, and (d) refining of the average grain size of the oxide sintered body is effective in suppressing cracking of the target material and also effective in improving in-plane uniformity of the deposited oxide semiconductor film. Moreover, they have found that (e) it is desirable to appropriately control the content of each metal element contained in the oxide sintered body, in order to obtain the oxide sintered body having such a phase composition. Thus, they have accomplished the present invention.

Furthermore, they have found that (f) it should be sufficient to perform sintering under predetermined sintering conditions in order to obtain the above oxide sintered body.

The oxide sintered body according to the present invention is an oxide sintered body (IGZTO) obtained by mixing and sintering a zinc oxide; an indium oxide; a gallium oxide; and a tin oxide. The sintered body affords a deposited oxide semiconductor film that tends to exhibit high carrier mobility and high etching resistance, as compared with the case of conventional In—Ga—Zn—O (IGZO).

Furthermore, by appropriately controlling the composition of the compound phases, relative density and average grain size of the oxide sintered body, the abnormal discharge and cracking of the target material during sputtering can be suppressed and an oxide semiconductor film having high carrier mobility can be deposited.

Next, the constitution of the oxide sintered body according to the present invention will be explained in detail. In the present invention, the oxide sintered body contains a $Zn_2SnO_4$ phase and $InGaZnO_4$ phase, as a main phase, in predetermined ratios and has the suppressed ratio of an $InGaZn_2O_5$ phase, as determined by X-ray diffractometry.

Conditions for X-ray diffractometry in the present invention are as follows.

Analyzer: "X-ray Diffractometer RINT-1500" manufactured by Rigaku Corporation

Analysis Conditions

Target: Cu

Monochromatization: Use of monochromator ($K_\alpha$)

Target output: 40 kV, 200 mA (Continuous Measurement): θ/2θ Scanning

Slits: Divergence slit: 1/2°, Scattering slit: 1/2°, Receiving slit: 0.15 mm

Monochromator receiving slit: 0.6 mm

Scanning speed: 2°/min
Sampling interval: 0.02°
Measurement angle (2θ): 5° to 90°

For diffraction peaks obtained in the measurement, compound phases having crystal structures described in 24-1470, 38-1104, 40-0252, and 41-1445 of ICDD (International Center for Diffraction Data) cards (corresponding to the $Zn_2SnO_4$ phase, the $InGaZnO_4$ phase, the $InGaZn_2O_5$ phase, and the $SnO_2$ phase, respectively) are identified.

Next, compounds to be detected by the above X-ray diffractometry and identified in the present invention will be explained in detail.

(With Regard to $Zn_2SnO_4$ Compound and $InGaZnO_4$ Compound)

The $Zn_2SnO_4$ compound (phase) is formed through bonding of ZnO and $SnO_2$ which constitute the oxide sintered body of the present invention. Moreover, the $InGaZnO_4$ compound (phase) is an oxide to be formed through bonding of In, Ga and Zn which constitute the oxide sintered body of the present invention. In the present invention, the above compounds remarkably contribute to an improvement in relative density of the oxide sintered body and a reduction in resistivity thereof. As a result, stable direct-current discharge is continuously obtained and an effect of suppressing abnormal discharge is enhanced.

In the present invention, the above $Zn_2SnO_4$ phase and $InGaZnO_4$ phase are contained as a main phase. As used herein, the term "main phase" means that the total of the ratios of the $Zn_2SnO_4$ phase and $InGaZSnO_4$ phase are the largest among all compounds detected by the above X-ray diffractometry.

Moreover, the meaning of the above $Zn_2SnO_4$ phase and $InGaZnO_4$ phase in the present invention also include those in which In, Ga, and/or Sn are dissolved in $Zn_2SnO_4$ and/or $InGaZnO_4$.

In order to form an oxide sintered body which enables the suppression of abnormal discharge and stable deposition in the sputtering method, it is necessary that the volume ratios of the above $Zn_2SnO_4$ phase and $InGaZnO_4$ phase identified by the above X-ray diffractometry (hereinafter "% by volume" of each phase is simply designated as "%") satisfy the following expressions (1) to (3).

(1): Ratio of $[Zn_2SnO_4]+[InGaZnO_4]((Zn_2SnO_4$ phase+$InGaZnO_4$ phase)/($Zn_2SnO_4$ phase+$InGaZnO_4$ phase+$InGaZn_2O_5$ phase+$SnO_2$ phase); hereinafter referred to as "ratio (1)")≥70%

Since the occurrence ratio of abnormal discharge increases as the ratio (1) decreases, the ratio should be 70% or more and is preferably 75% or more, more preferably 80% or more. On the other hand, with regard to the upper limit, in view of performance, the higher the ratio is, the better the performance is. For example, the ratio may be 100% but, from the viewpoint of easiness in production, the ratio is preferably 97.5% or less, more preferably 95% or less.

(2): Ratio of $[Zn_2SnO_4](Zn_2SnO_4$ phase/($Zn_2SnO_4$ phase+$InGaZnO_4$ phase+$InGaZn_2O_5$ phase+$SnO_2$ phase); hereinafter referred to as "ratio (2)")≥30%

Since the effect of suppressing abnormal discharge is sometimes not sufficiently obtained when the ratio (2) is small even if the above ratio (1) is satisfied, the ratio (2) should be 30% or more and is preferably 40% or more, more preferably 50% or more, further preferably 55% or more. On the other hand, the upper limit is not particularly limited but, from the viewpoint of securing the $InGaZnO_4$ phase, the ratio is preferably 90% or less, more preferably 80% or less, further preferably 70% or less.

(3): Ratio of $[InGaZnO_4](InGaZnO_4$ phase/($Zn_2SnO4$ phase+$InGaZnO_4$ phase+$InGaZn_2O_5$ phase+$SnO_2$ phase); hereinafter referred to as "ratio (3)")≥10%

Since the relative density cannot be increased and the effect of suppressing abnormal discharge is not sufficiently obtained in some cases when the ratio (3) is small even if the above ratios (1) and/or (2) are satisfied, the ratio (3) should be 10% or more and is preferably 12% or more, more preferably 15% or more. On the other hand, the upper limit is not particularly limited but, from the viewpoint of securing the $Zn_2SnO_4$ phase, the ratio is preferably 60% or less, and from the viewpoint of easiness in production, the ratio is more preferably 30% or less, further preferably 25% or less.

(With Regard to $InGaZn_2O_5$ Phase)

The $InGaZn_2O_5$ phase is an oxide formed through bonding of In, Ga and Zn which constitute the oxide sintered body of the present invention. In the present invention, it is necessary that the volume ratio of the $InGaZn_2O_5$ phase, as determined by the above X-ray diffractometry, satisfies the following expression (4).

(4): Ratio of $[InGaZn_2O_5](InGaZn_2O_5$ phase/($Zn_2SnO_4$ phase+$InGaZnO_4$ phase+$InGaZn_2O_5$ phase+$SnO_2$ phase); hereinafter referred to as "ratio (4)")≤3%

When the ratio (4) exceeds 3%, the abnormal discharge and/or cracking of the target material are prone to occur. Therefore, the ratio (4) is 3% or less, preferably 2.5% or less, more preferably 2.0% or less, further preferably 1.0% or less, particularly preferably 0.5% or less. The ratio (4) may be 0%.

The $InGaZn_2O_5$ phase can be removed by making temperature high. However, only when the sintering temperature is simply made high, the grains actively grow and the grain size becomes large. As a result, the strength decreases and the target material is cracked. Therefore, it is important to perform the production using a material having an appropriate composition by a suitable production method to be mentioned later.

The compound phases of the oxide sintered body of the present invention are desirably composed of substantially the $Zn_2SnO_4$ phase, the $InGaZnO_4$ phase, the $InGaZn_2O_5$ phase, and the $SnO_2$ phase and the ratio of these compound phases among all the compound phases is preferably 75% or more. As compound phases which may be contained, an $In_2O_3$ phase, a $ZnGa_2O_4$ phase, a $(ZnO)_m In_2O_3$ phase (m is an integer of 2 or more) and the like, which are unavoidably formed during production, may be contained in a ratio of 25% or less. The ratio of the compound phases unavoidably formed can be measured by X-ray diffractometry (XRD).

Furthermore, the relative density of the oxide sintered body of the present invention is 85% or more. When the relative density of the oxide sintered body is increased, not only the above effect of suppressing the occurrence of abnormal discharge can be further enhanced, but also an advantage of continuously maintaining stable discharge during target life and the other advantage can be attained. For obtaining such effects, it is necessary for the oxide sintered body of the present invention to have a relative density of at least 85% or more and the relative density is preferably 90% or more, more preferably 95% or more. The relative density is preferably 110% or less, more preferably 105% or less.

The relative density of the oxide sintered body is measured by the Archimedes' method.

Moreover, in order to further enhance the effect of suppressing abnormal discharge and the effect of suppressing cracking of the target material, it is necessary to refine the average grain size of grains of the oxide sintered body.

Specifically, by controlling the average grain size of the grains observed by SEM (scanning electron microscope) on a fracture surface (any position of a cut surface when the oxide sintered body is cut at any position in a thickness direction) of the oxide sintered body (or a sputtering target using the oxide sintered body) to preferably less than 10 μm, the occurrence of the abnormal discharge and cracking of the target material can be still further suppressed. The average grain size is more preferably 8 μm or less, further preferably 6 μm or less. On the other hand, the lower limit of the average grain size is not particularly limited but, in view of the refining effect and production costs, the lower limit of the average grain size is preferably about 0.1 μm.

With regard to the average grain size of the grains, the structure of the fracture surface of the oxide sintered body (or the sputtering target) is observed by SEM (magnification: 400 times), a straight line having a length of 100 μm is drawn in an arbitrary direction, the number (N) of grains contained in the straight line is determined, and a value calculated from [100/N] is taken as an average grain size on the straight line. In the present invention, 20 straight lines are drawn at intervals of 20 μm or more, "average grain sizes on individual straight lines" are calculated, and a value calculated from [the sum of average grain sizes on individual straight lines/20] is taken as the average grain size of the grains.

Also, in order to obtain an oxide sintered body having the above phase composition which has the effects of high carrier mobility and suppressing the occurrence of the abnormal discharge and cracking of the target material, it is desirable to appropriately control the content of each metal element contained in the oxide sintered body.

Specifically, when content ratios (atomic %) of individual metal elements (zinc, indium, gallium, and tin) to all the metal elements, but excluding oxygen, which are contained in the oxide sintered body are taken as [Zn], [In], [Ga] and [Sn], respectively, the oxide sintered body desirably satisfies the following expressions (5) to (7):

$$40 \text{ atomic \%} \leq [Zn] \leq 50 \text{ atomic \%} \quad (5)$$

$$30 \text{ atomic \%} \leq ([In]+[Ga]) \leq 45 \text{ atomic \%} \quad (6)$$

wherein [In] is 4 atomic % or more and [Ga] is 5 atomic % or more, $$15 \text{ atomic \%} \leq [Sn] \leq 25 \text{ atomic \%} \quad (7).$$

In the present description, [Zn] means the content of Zn (atomic %; hereinafter "atomic %" of the content of each metal element is simply designated as "%") relative to all the metal elements excluding oxygen (O) (Zn, In, Ga, and Sn). Similarly, [In], [Ga], and [Sn] mean individual content ratios (atomic %) of In, Ga, and Sn relative to all the metal elements excluding oxygen (O) (Zn, In, Ga, and Sn), respectively.

First, the above expression (5) defines the Zn ratio ([Zn]) in all the metal elements and is set from the viewpoint of mainly controlling the above $Zn_2SnO_4$ phase and $InGaZnO_4$ phase to the above predetermined ratios (1) to (3). When [Zn] is too small, it becomes difficult to satisfy the ratios (1) to (3) of the above compound phases and the effect of suppressing abnormal discharge is not sufficiently obtained. Therefore, [Zn] is preferably 40% or more, more preferably 42% or more. On the other hand, when [Zn] is too large, the ratios of In, Ga, and Sn relatively decrease and desired ratios of the compound phases are not obtained, and thus, [Zn] is preferably 50% or less, more preferably 48% or less.

The above expression (6) defines the sum of the In ratio and the Ga ratio ([In]+[Ga]) in all the metal elements and is set from the viewpoint of mainly controlling the $InGaZnO_4$ phase to the above predetermined ratios (1) and (3). When [In]+[Ga] is too small, it becomes difficult to satisfy the ratios (1) and (3) of the above compound phases. Therefore, [In]+[Ga] is preferably 30% or more, more preferably 32% or more. On the other hand, when [In]+[Ga] is too large, the carrier mobility of the oxide semiconductor film after deposition sometimes decreases, and thus, [In]+[Ga] is preferably 45% or less, more preferably 43% or less.

Both of In and Ga are essential elements, and [In] is preferably 4% or more, more preferably 5% or more. When [In] is too small, the effect of improving the relative density of the oxide sintered body and the reduction in resistivity cannot be achieved and the carrier mobility of the oxide semiconductor film after deposition also decreases.

Moreover, [Ga] is preferably 5% or more, more preferably 10% or more. When the [Ga] ratio is too small, the ratio (3) of the above compound phases relatively decreases in some cases.

The above expression (7) defines the Sn ratio ([Sn]) in all the metal elements and is set from the viewpoint of mainly controlling the above $Zn_2SnO_4$ phase to the above predetermined ratios (1) and (2). When [Sn] is too small, it becomes difficult to satisfy the ratios (1) and (2) of the above compound phases, and thus, [Sn] is preferably 15% or more, more preferably 16% or more. On the other hand, when [Sn] is too large, the carrier mobility of the oxide semiconductor film after deposition sometimes decreases, and thus, [Sn] is preferably 25% or less, more preferably 22% or less.

It should be sufficient that the contents of the metal elements are controlled within the above ranges and the oxide sintered body of the present invention may contain oxides unavoidably formed during production.

Furthermore, the sputtering target obtained using the oxide sintered body of the present invention has a resistivity of 1 Ω·cm or less, preferably $10^{-1}$ Ω·cm or less, more preferably $10^{-2}$ Ω·cm or less, further preferably $10^{-3}$ Ω·cm or less. It becomes possible to perform the deposition with the further suppression of the abnormal discharge and cracking of the target material during sputtering, and physical vapor deposition (sputtering method) using the sputtering target can be efficiently performed in production lines of display devices. Moreover, the resistivity of the sputtering target is preferably $10^{-7}$ Ω·cm or more, more preferably $10^{-6}$ Ω·cm or more, further preferably $10^{-5}$ Ω·cm or more.

The resistivity of the sputtering target is determined by the four-terminal method.

Next, a method of producing the oxide sintered body of the present invention will be explained.

The oxide sintered body of the present invention may be obtained by mixing and sintering a zinc oxide; an indium oxide; a gallium oxide; and a tin oxide, and the sputtering target can be produced by machining the oxide sintered body. FIG. 1 illustrates basic steps of subjecting oxide powders to (a) mixing/pulverization→(b) drying/granulation→(c) preforming→(d) degreasing→(e) hot pressing and subjecting the resulting oxide sintered body to (f) machining→(g) bonding, thereby giving a sputtering target. Of the above steps, the present invention is characterized in that the sintering conditions ((e) hot pressing) are suitably controlled as described in detail below. The other steps are not particularly limited and generally used steps may be suitably selected. Respective steps will be explained below, but the present invention is by no means limited thereto.

Initially, a zinc oxide powder; an indium oxide powder; a gallium oxide powder; and a tin oxide powder are blended in predetermined ratios, followed by mixing and pulverizing. The material powders to be used preferably each have a purity of about 99.99% or more. This is because an impurity element, if present in a trace amount, may impair semiconducting properties of the oxide semiconductor film. The blending ratios of the material powders are preferably controlled so as to give ratios falling within the aforementioned ranges.

The (a) mixing/pulverization are preferably performed in a ball mill by placing the material powders together with water in the mill. A ball or bead to be used in these steps is preferably formed of a material, for example, a nylon, alumina, or zirconia. On this occasion, a dispersant may be mixed for the purpose of homogeneous mixing and a binder may be mixed for securing easiness of the subsequent forming step.

Next, a mixed powder obtained in the above step is preferably subjected to (b) drying/granulation by means of, for example, a spray drier.

After drying/granulation, (c) preforming is performed. For the forming, the powder after drying/granulation is charged into a die having predetermined dimensions and is preformed through a die press. Since the preforming is performed for the purpose of improving handling properties when setting in a predetermined die in the hot pressing step, it should be sufficient to form a compact by applying a pressure of about 0.5 to 1.0 tonf/cm$^2$.

In the case where a dispersant or binder is added to the mixed powder, it is desirable to perform (d) degreasing by heating the compact for the purpose of removing the dispersant and the binder. The heating conditions are not particularly limited as long as the purpose of degreasing can be achieved but, for example, the compact may be kept in the air at about 500° C. for about 5 hours.

After degreasing, the compact is set in a graphite die having a desired shape, followed by sintering by (e) hot pressing. The graphite die is a reducing material and the set compact can be sintered in a reducing atmosphere, so that reduction efficiently proceeds and resistivity can be reduced.

Figure 2:
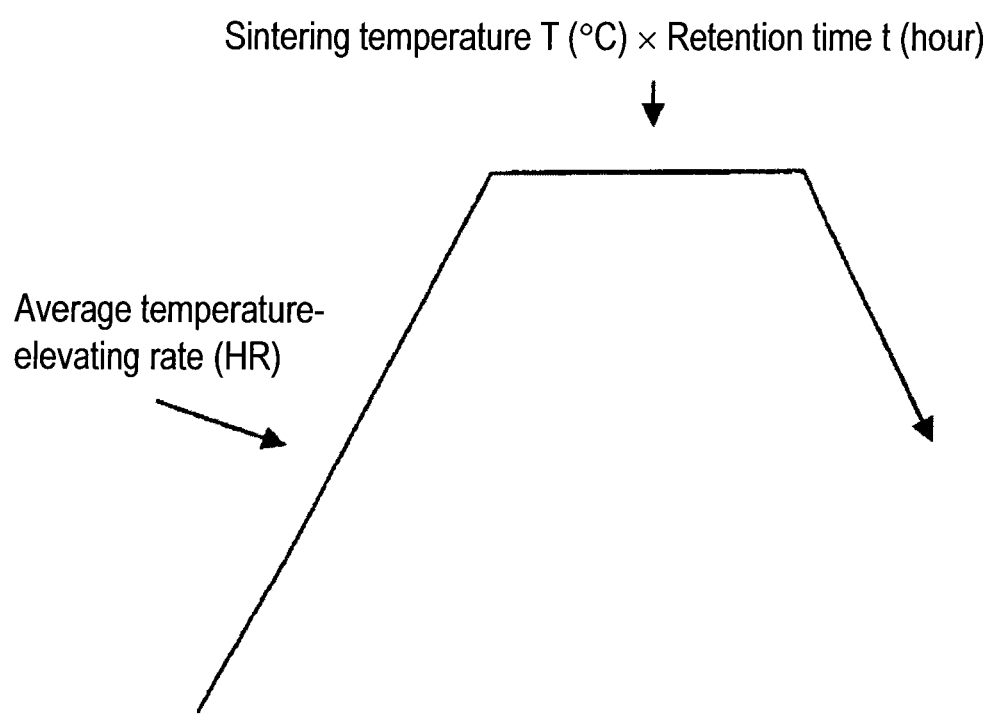
FIG. 2 is a graph illustrating one example of the sintering step for use in the production method according to the present invention.

In the present invention, sintering is performed at a sintering temperature of 950 to 1150° C. for a retention time of 0.1 to 5 hours at the temperature (FIG. 2). By using the temperature range and retention time, the sintered body having compound phases satisfying the aforementioned ratios (1) to (4) and having a suitable grain size is obtained. When the sintering temperature is low, the ratio of the InGaZn$_2$O$_5$ phase cannot be suppressed to the above-described ratio or less. Also, the sintered body cannot be sufficiently densified and desired relative density cannot be achieved. On the other hand, when the sintering temperature is too high, the grains are coarsened and the average grain size of the grains cannot be controlled to the predetermined range. Therefore, it is desirable that the sintering temperature is controlled to 950° C. or higher, preferably 975° C. or higher, more preferably 1000° C. or higher and 1150° C. or lower, preferably 1125° C. or lower, more preferably 1100° C. or lower.

Moreover, when the retention time at the above sintering temperature is too long, the grains grow and are coarsened, so that the average grain size of the grains cannot be controlled to the predetermined range. On the other hand, when the retention time is too short, the ratio of the InGaZn$_2$O$_5$ cannot be suppressed to the above-described range or less and the sintered body cannot be sufficiently densified. Therefore, it is desirable to control the retention time to 0.1 hours or more, preferably 0.5 hours or more and 5 hours or less.

Also in the present invention, after preforming, an average temperature-elevating rate (HR) to the above sintering temperature is preferably controlled to 600° C./hr or less. When the average temperature-elevating rate exceeds 600° C./hr, abnormal growth of the grains occurs. Also, the relative density cannot sufficiently be increased. The average temperature-elevating rate is preferably 500° C./hr or less, further preferably 300° C./hr or less. On the other hand, the lower limit of the average temperature-elevating rate is not particularly limited but, from the viewpoint of productivity, it is preferably 10° C./hr or more, more preferably 20° C./hr or more.

In the above sintering step, the pressurization condition during hot pressing is not particularly limited but, for example, it is desirable to apply a surface pressure of 600 kgf/cm$^2$ or less. When the pressure is too low, densification does not sufficiently proceed in some cases. On the other hand, when the pressure is too high, the graphite die may be broken, and also an effect of promoting densification is saturated and an increase in size of a pressing equipment is needed. A preferable pressurization condition is 150 kgf/cm$^2$ or more and 400 kgf/cm$^2$ or less.

In the sintering step, in order to suppress oxidation and disappearance of graphite, as the sintering atmosphere, an inert gas atmosphere or a vacuum atmosphere is preferable. The controlling method of the atmosphere is not particularly limited and, for example, the atmosphere may be regulated by introducing Ar gas or N$_2$ gas into a furnace. Moreover, the pressure of the atmosphere gas is desirably controlled to the atmospheric pressure for suppressing evaporation of zinc oxide having high vapor pressure. The oxide sintered body obtained as above has a relative density of 85% or more.

After the oxide sintered body is obtained as described above, it is subjected to (f) machining→(g) bonding according to common procedures, thereby obtaining a sputtering target of the present invention. The thus obtained sputtering target is also very satisfactory in resistivity and has a resistivity of about 1 Ω·cm or less.

EXAMPLES

The present invention will be explained in further detail below with reference to Examples. The present invention is not limited to the following Examples and it is possible to carry out the present invention with appropriate changes within the range where they do not depart from the gist of the present invention, and all of them fall within the scope of the present invention.

(Preparation of Sputtering Target)

An indium oxide powder (In$_2$O$_3$) having a purity of 99.99%, a zinc oxide powder (ZnO) having a purity of 99.99%, a gallium oxide powder (Ga$_2$O$_3$) having a purity of 99.99%, and a tin oxide powder (SnO$_2$) having a purity of 99.99% were blended in ratios shown in Table 2, and water and a dispersant (ammonium polycarboxylate) were added thereto, followed by mixing in a zirconia ball mill for 24 hours. Then, the mixed powder obtained in the above step was dried and granulated.

After the powder thus obtained was preformed through a die press (forming pressure: 1.0 ton/cm$^2$, size of compact: φ110×t 13 mm, where t is thickness), the temperature was elevated to 500° C. in the air atmosphere under normal pressure and the temperature was kept for 5 hours, thereby performing degreasing.

The resulting compact was set in a graphite die and hot pressing was performed under conditions (A to D) shown in Table 3. On this occasion, $N_2$ gas was introduced into a hot pressing furnace and sintering was performed in an $N_2$ atmosphere.

The resulting sintered body was machined into dimensions of ϕ110×t 5 mm and bonded to a Cu backing plate, thereby preparing a sputtering target.

(Preparation of Thin-Film Transistor)

The sputtering target thus obtained was set in a sputtering apparatus and an oxide semiconductor film was formed on a glass substrate (size: 100 mm×100 mm×0.50 mm) by a DC (direct-current) magnetron sputtering method. The sputtering conditions were as follows: a DC sputtering power of 150 W, an atmosphere of Ar/0.1% by volume $O_2$, a pressure of 0.8 mTorr. Further, using a thin film deposited under these conditions, a thin-film transistor having a channel length of 10 μm and a channel width of 100 μm was prepared.

(Measurement of Relative Density)

The relative density was calculated according to the Archimedes' method after the target was taken out from the backing plate after sputtering and polished. When the relative density was 85% or more, the sample was evaluated as passed (see "Relative density (%)" in Table 4).

The relative density is a percent value obtained by dividing the density (g/cm³) as measured by the Archimedes' method by theoretical density ρ (g/cm³), and the theoretical density p was calculated as follows.

$$\rho = \left[ \frac{W_1/100}{5.61} + \frac{W_2/100}{7.18} + \frac{W_3/100}{5.95} + \frac{W_4/100}{6.95} \right]^{-1} \quad [\text{Math. 1}]$$

Here, $W_1$ is a blending amount of ZnO [wt %], $W_2$ is a blending amount of $In_2O_3$ [wt %], $W_3$ is a blending amount of $Ga_2O_3$ [wt %], and $W_4$ is a blending amount of $SnO_2$ [wt %].

(Measurement of Resistivity)

The resistivity of the sintered body was measured for the above-prepared sputtering target by the four-terminal method. When the resistivity is 1 Ω·cm or less, the sample was evaluated as passed.

(Average Grain Size of Grains)

With regard to the average grain size of grains, the structure of an oxide sintered body surface was observed by SEM (magnification: 40 times), a straight line having a length of 100 μm was drawn in an arbitrary direction, the number (N) of grains contained in the straight line was determined, and a value calculated from [100/N] was taken as an average grain size on the straight line. Similarly, 20 straight lines were drawn at intervals of 20 to 30 μm and average grain sizes on individual straight lines were calculated, and a value calculated from [the sum of average grain sizes on individual straight lines/20] was taken as the average grain size of grains. Grains having an average grain size of less than 10 μm were evaluated as passed (see "Average grain size (μm)" in Table 4).

(Ratio of Compound Phase)

The ratio of each compound phase was determined by taken out the target from the backing plate after sputtering, cutting out a test piece having 10 mm square, and measuring strength of diffraction lines by X-ray diffractometry.

Analyzer: "X-ray Diffractometer RINT-1500" manufactured by Rigaku Corporation

Analysis Conditions:

Target: Cu

Monochromatization: Use of monochromator (1c)

Target output: 40 kV, 200 mA (Continuous Measurement): θ/2θ Scanning

Slits: Divergence slit: 1/2°, Scattering slit: 1/2°, Receiving slit: 0.15 mm

Monochromator receiving slit: 0.6 mm

Scanning speed: 2°/min

Sampling interval: 0.02°

Measurement angle (2θ): 5° to 90°

For diffraction peaks obtained in the measurement, the peaks of the individual compound phases as shown in Table 1 were identified based on ICDD (International Center for Diffraction Data) cards and height of the diffraction peaks was measured. As these peaks, among the compound phases, peaks having high diffraction strength and showing less overlap with the peaks of the other compound phases as far as possible were selected. Measured values of peak height of designated peaks for individual compound phases were taken as $I[SnO_2]$, $I[Zn_2SnO_4]$, $I[InGaZnO_4]$, and $I[InGaZn_2O_5]$ ("I" means that the value is a measured value), respectively, and the volume ratios were determined according to the following expressions (individual volume ratios (%) in Table 4).

$$[Zn_2SnO_4]+[InGaZnO_4]=(I[Zn_2SnO_4]+I[InGaZnO_4])/\\(I[Zn_2SnO_4]+I[InGaZnO_4]+I[InGaZn_2O_5]+I[SnO_2])\times 100 \quad (1)$$

$$[Zn_2SnO_4]=I[Zn_2SnO_4]/(I[Zn_2SnO_4]+I[InGaZnO_4]+I[InGaZn_2O_5]+I[SnO_2])\times 100 \quad (2)$$

$$[InGaZnO_4]=I[InGaZnO_4]/(I[Zn_2SnO_4]+I[InGaZnO_4]+I[InGaZn_2O_5]+I[SnO_2])\times 100 \quad (3)$$

$$[InGaZn_2O_5]=I[InGaZn_2O_5]/(I[Zn_2SnO_4]+I[InGaZnO_4]+I[InGaZn_2O_5]+I[SnO_2])\times 100 \quad (4)$$

Peaks of compound phases other than the above ones were hardly observed.

With regard to the ratios of compound phases, one having $[Zn_2SnO_4]$ of 30% or more, $[InGaZnO_4]$ of 10% or more, $[Zn_2SnO_4]+[InGaZnO_4]$ of 70% or more, and $[InGaZn_2O_5]$ of 3% or less was evaluated as passed (see Table 4).

(Evaluation of Abnormal Discharge and Cracking of Target Material)

The above sintered body was machined into a shape of 4 inches in diameter and 5 mm in thickness and was bonded to a backing plate to obtain a sputtering target. The sputtering target thus obtained was set in a sputtering apparatus, followed by DC (direct-current) magnetron sputtering. The sputtering conditions are as follows: a DC sputtering power of 150 W, an atmosphere of Ar/0.1% by volume $O_2$, a pressure of 0.8 mTorr. The number of times of occurrence of arching per 100 minutes on this occasion was counted, and a sample showing that the number of times was 2 or less and the cracking of the target material was absent after 100 hours of discharge was evaluated as passed (good) (see "Number of times of abnormal discharge" and "Presence or absence of cracking" in Table 4). The presence or absence of cracking of the target material was visually observed.

The results are shown in Table 4.

TABLE 1

| Crystal phase | ICDD card No. to be referred to | Peak position to be measured |
|---|---|---|
| $Zn_2SnO_4$ | 24-1470 | around 34° |
| $InGaZnO_4$ | 38-1104 | around 31° |
| $InGaZn_2O_5$ | 40-0252 | around 24° |
| $SnO_2$ | 41-1445 | around 26° |

TABLE 2

| Component | Content ratio (atomic %) | | | | |
|---|---|---|---|---|---|
| | | | | [In] + [Ga] | |
| | [Zn] | [In] | [Ga] | Sum | [Sn] |
| a | 47.2 | 16.6 | 16.8 | 33.4 | 19.4 |
| b | 42.3 | 6.5 | 35.0 | 41.5 | 16.3 |

TABLE 3

| Production conditions | Sintering temperature T (° C.) | Retention time t (hour) | Average temperature-elevating rate HR (° C./hour) | Pressing pressure (kgf/cm$^2$) |
|---|---|---|---|---|
| A | 1000 | 1 | 300 | 300 |
| B | 1100 | 1 | 600 | 300 |
| C | 1030 | 0 | 600 | 300 |
| D | 1200 | 1 | 600 | 300 |

TABLE 4

| No. | Component | Production conditions | Relative density (%) | Average grain size (μm) | [Zn$_2$SnO$_4$] phase Volume ratio (%) | [InGaZnO$_4$] phase Volume ratio (%) | [Zn$_2$SnO$_4$] phase + [InGaZnO$_4$] phase Volume ratio (%) | [InGaZn$_2$O$_5$] phase Volume ratio (%) | Resistivity (Ω · cm) | Number of times of abnormal discharge | Presence or absence of cracking |
|---|---|---|---|---|---|---|---|---|---|---|---|
| 1 | a | A | 99 | 1.5 | 72.8 | 16.6 | 89.4 | 0.5 | 10^(−3) | 1 | absent |
| 2 | a | B | 98 | 6 | 72.4 | 27.4 | 99.8 | 0.1 | 10^(−3) | 0 | absent |
| 3 | a | C | 93 | 4 | 55.9 | 26.5 | 82.4 | 4.1 | 10^(−2) | 1 | present |
| 4 | a | D | 99 | 15 | 74.1 | 25.9 | 100 | 0 | 10^(−3) | 3 | absent |
| 5 | b | A | 99 | 3.1 | 53.8 | 36.2 | 90 | 1.3 | 10^(−3) | 1 | absent |
| 6 | b | C | 91 | 2.9 | 38.8 | 42.1 | 80.9 | 7.2 | 10^(−3) | 1 | present |

In Nos. 1, 2, and 5 where preferable compositions and production conditions of the present invention were satisfied, abnormal discharge and cracking of the target materials were suppressed. Namely, when sputtering was performed, abnormal discharge occurred twice or less and no cracking of the target materials was observed, so that it was confirmed that discharge was stably performed. Moreover, with regard to resistivity of the sputtering targets thus obtained, good results were obtained.

On the other hand, in Nos. 3 and 6, since retention at the sintering temperature T was not performed for the predetermined time (retention time t=0), the volume ratio of [InGaZn$_2$O$_5$] increased and cracking of the target materials occurred.

Moreover, in No. 4, since the sintering temperature was high (sintering temperature T=1200° C.), the grains were coarsened and hence abnormal discharge occurred many times.

While the present invention has been described in detail and with reference to specific embodiments thereof, it will be apparent to one skilled in the art that various changes and modifications can be made therein without departing from the spirit and scope thereof.

The present application is based on Japanese Patent Application No. 2012-203576 filed on Sep. 14, 2012, and the contents thereof are incorporated herein by reference.

INDUSTRIAL APPLICABILITY

According to the present invention, it is possible to provide: an oxide sintered body and sputtering target, which enable the suppression of abnormal discharge and cracking of the target material during the deposition of the oxide semiconductor films, and stable deposition by a sputtering method; and a method of producing the same.

The invention claimed is:

1. An oxide sintered body, obtained by mixing and sintering a zinc oxide; an indium oxide; a gallium oxide; and a tin oxide,
wherein
the oxide sintered body has a relative density of 85% or more;
the oxide sintered body has an average grain size of less than 10 μm;
the oxide sintered body has volume ratios of a Zn$_2$SnO$_4$ phase and an InGaZnO$_4$ phase, which satisfy the following expressions (1) to (3), respectively, and has a volume ratio of an InGaZn$_2$O$_5$ phase which satisfies the following expression (4), as determined by X-ray diffractometry:

(Zn$_2$SnO$_4$ phase+InGaZnO$_4$ phase)/(Zn$_2$SnO$_4$ phase+InGaZnO$_4$ phase+InGaZn$_2$O$_5$ phase+SnO$_2$ phase)≥70% by volume     (1), Zn$_2$SnO$_4$ phase/(Zn$_2$SnO$_4$ phase+InGaZnO$_4$ phase+InGaZn$_2$O$_5$ phase+SnO$_2$ phase)≥30% by volume     (2), InGaZnO$_4$ phase/(Zn$_2$SnO$_4$ phase+InGaZnO$_4$ phase+InGaZn$_2$O$_5$ phase+SnO$_2$ phase)≥10% by volume     (3), and 0% by volume≤InGaZn$_2$O$_5$ phase/(Zn$_2$SnO$_4$ phase+InGaZnO$_4$ phase+InGaZn$_2$O$_5$ phase+SnO$_2$ phase)≤3% by volume     (4); and the oxide sintered body has a total ratio of the Zn$_2$SnO$_4$ phase, the InGaZnO$_4$ phase, the InGaZn$_2$O$_5$ phase, and the SnO$_2$ phase among all compound phases of 75% or more, as determined by the X-ray diffractometry.

2. The oxide sintered body according to claim 1, which satisfies the following expressions (5) to (7) when content ratios by atomic % of zinc, indium, gallium, and tin relative to all metal elements contained in the oxide sintered body are taken as [Zn], [In], [Ga], and [Sn], respectively:

40 atomic %≤[Zn]≤50 atomic %     (5), 30 atomic %≤([In]+[Ga])≤45 atomic %     (6), wherein [In] is 4 atomic % or more, and [Ga] is 5 atomic % or more, and 15 atomic % [Sn]≤25 atomic %     (7).

3. The oxide sintered body according to claim 1, wherein the average grain size is 0.1 μm or more.

4. The oxide sintered body according to claim 1, wherein the relative density is 110% or less.

5. The oxide sintered body according to claim 1, wherein the volume ratio of the $Zn_2SnO_4$ phase and the $InGaZnO_4$ phase satisfies the following expression (1'):

$$(Zn_2SnO_4\ phase + InGaZnO_4\ phase)/(Zn_2SnO_4\ phase + InGaZnO_4\ phase + InGaZn_2O_5\ phase + SnO_2\ phase) \leq 100\%\ by\ volume \quad (1').$$

6. The oxide sintered body according to claim 1, wherein the volume ratio of the $Zn_2SnO_4$ phase satisfies the following expression (2'):

$$Zn_2SnO_4\ phase/(Zn_2SnO_4\ phase + InGaZnO_4\ phase + InGaZn_2O_5\ phase + SnO_2\ phase) \leq 90\%\ by\ volume \quad (2').$$

7. The oxide sintered body according to claim 1, wherein the volume ratio of the $InGaZnO_4$ phase satisfies the following expression (3'):

$$InGaZnO_4\ phase/(Zn_2SnO_4\ phase + InGaZnO_4\ phase + InGaZn_2O_5\ phase + SnO_2\ phase) \leq 60\%\ by\ volume \quad (3').$$

8. The oxide sintered body according to claim 1, wherein the volume ratio of the $InGaZn_2O_5$ phase satisfies the following expression (4'):

$$InGaZn_2O_5\ phase/(Zn_2SnO_4\ phase + InGaZnO_4\ phase + InGaZn_2O_5\ phase + SnO_2\ phase) \geq 0\%\ by\ volume \quad (4').$$

9. A sputtering target, obtained from the oxide sintered body according to claim 1, wherein the sputtering target has a resistivity of 1 Ω·cm or less.

10. The sputtering target according to claim 9, wherein the resistivity is $10^{-7}$ Ω·cm or more.

11. A method for producing the oxide sintered body according to claim 1, the method comprising:
   mixing a zinc oxide, an indium oxide, a gallium oxide, and a tin oxide to obtain a mixture;
   subsequently setting the mixture in a graphite die and elevating a temperature to a sintering temperature of 950 to 1150° C. at an average temperature-elevating rate of 600° C./hr or less; and
   subsequently sintering for a retention time of 0.1 to 5 hours in at the sintering temperature.

12. The method according to claim 11, wherein the average temperature-elevating rate is 10° C./hr or more.

13. The method according to claim 11, wherein the sintering temperature is 975 to 1150° C.

14. The method according to claim 11, wherein the sintering is performed in an inert gas atmosphere.

* * * * *